United States Patent [19]

McNeilly

[11] Patent Number: 5,044,314

[45] Date of Patent: * Sep. 3, 1991

[54] SEMICONDUCTOR WAFER PROCESSING APPARATUS

[75] Inventor: Michael A. McNeilly, Palo Alto, Calif.

[73] Assignee: Advantage Production Technology, Inc., Sunnyvale, Calif.

[*] Notice: The portion of the term of this patent subsequent to Oct. 18, 2005 has been disclaimed.

[21] Appl. No.: 257,855

[22] Filed: Oct. 14, 1988

Related U.S. Application Data

[63] Continuation-in-part of Ser. No. 919,313, Oct. 15, 1986, Pat. No. 4,778,559.

[51] Int. Cl.$^5$ .................................................. C23C 16/00
[52] U.S. Cl. .................................. 118/715; 118/500; 118/719; 118/725; 118/728; 156/345; 156/646; 427/248.1
[58] Field of Search ................ 15/330, 345; 118/500, 118/715, 719, 725, 728; 134/25.1, 25.4, 31, 37, 42; 156/345, 646; 219/390, 460, 462, 530, 540; 427/248.1

[56] References Cited

U.S. PATENT DOCUMENTS

| | | | |
|---|---|---|---|
| 2,897,331 | 7/1959 | McFarlane et al. | 219/20 |
| 3,083,286 | 3/1963 | Swetlitz | 219/19 |
| 3,391,270 | 7/1968 | Harris et al. | 219/385 |
| 3,505,499 | 4/1970 | Walther | 219/439 |
| 3,536,893 | 10/1970 | Cranley | 219/523 |
| 3,598,082 | 8/1971 | Rice | 118/719 |
| 3,623,712 | 11/1971 | McNeilly | 263/42 |
| 3,656,454 | 4/1972 | Schrader | 118/719 |
| 3,673,385 | 6/1972 | Drugmand et al. | 219/335 |
| 3,815,575 | 6/1974 | Danis | 126/390 |
| 3,983,359 | 9/1976 | Walker et al. | 219/284 |
| 4,047,496 | 9/1977 | McNeilly et al. | 118/725 |
| 4,081,313 | 3/1978 | McNeilly et al. | 156/610 |
| 4,127,437 | 11/1978 | Bersin et al. | 156/635 |
| 4,264,374 | 4/1981 | Beyer et al. | 134/3 |
| 4,274,936 | 6/1981 | Love | 118/719 |
| 4,401,507 | 8/1983 | Engle | 156/646 |
| 4,402,997 | 9/1983 | Hogan et al. | 118/715 |
| 4,456,186 | 6/1984 | Ando | 219/300 |
| 4,496,609 | 1/1985 | McNeilly et al. | 427/55 |
| 4,579,609 | 4/1986 | Reif et al. | 427/39 |
| 4,605,479 | 8/1986 | Faith, Jr. | 156/646 |
| 4,609,428 | 9/1986 | Fujimura | 156/345 |
| 4,659,401 | 4/1987 | Reif et al. | 427/39 |
| 4,668,338 | 5/1987 | Maydan et al. | 156/345 |
| 4,668,365 | 5/1987 | Foster et al. | 156/643 |
| 4,749,440 | 6/1988 | Blackwood et al. | 156/646 |
| 4,778,559 | 10/1988 | McNeilly | 156/612 |

FOREIGN PATENT DOCUMENTS

| | | |
|---|---|---|
| A10016579 | 10/1980 | European Pat. Off. |
| 0082092 | 6/1983 | European Pat. Off. ........... 219/319 |
| A12258074 | 1/1975 | France . |
| 60-249328 | 12/1985 | Japan ................................... 118/719 |
| 2109996 | 6/1983 | United Kingdom . |
| A2121603 | 12/1983 | United Kingdom . |
| A2158289 | 11/1985 | United Kingdom . |

OTHER PUBLICATIONS

Holmes, P. J. and J. E. Snell, "A Vapor Etching Technique for the Photolithography of Silicon Dioxide", Microelectronics and Reliability (Pergamon Press, 1966), vol. 5, pp. 337–341.

Primary Examiner—Shrive Beck
Assistant Examiner—Terry J. Owens
Attorney, Agent, or Firm—Limbach, Limbach & Sutton

[57] ABSTRACT

A semiconductor wafer processing apparatus has a processing housing including a pair of coaxial hollow cylindrical members each defining an inner cylindrical chamber for directing a treatment medium toward a wafer and an annular chamber for withdrawing the treatment medium. A wafer support which can include a heater holds one or two wafers substantially normal to the axis of the processing housing. The treatment medium is introduced in vapor phase at very low to high velocity and at subatmospheric to superatmospheric pressure. Radiation can be introduced into the housing, and wafers can be automatically moved into and out of the housing and from the housing to another treating apparatus.

12 Claims, 4 Drawing Sheets

OTHER PUBLICATIONS

Beyer, K. D. and M. H. Whitehill, "Etching of $SiO_2$ in Gaseous $HF/H_2O$", IBM Technical Disclosure Bulletin, vol. 19, No. 7 (Dec. 1976), p. 2513.

Beyer, K. D., "Silicon Surface Cleaning Process", IBM Technical Disclosure Bulletin, vol. 20, No. 5 (Oct. 1977), pp. 1746–1747.

Bersin, Richard L. and Richard F. Reichelderfer, "The DryOx TM Process for Etching Silicon Dioxide", Solid State Technology (Apr. 1977), pp. 77–79.

Beyer, K. D. and T. M. Reith, "Removal of Native Oxide Layer on a Semiconductor Surface", IBM Technical Disclosure Bulletin, vol. 22, No. 7 (Dec. 1979), p. 2839.

Jun-Ru, Ma et al., "A New Conformal Dry-Etch Technique for Submicrometer Structures", J. Vac. Sci. Technol., vol. 19, No. 4 (Nov./Dec. 1981), pp. 1385–1389.

Soviet Inventions Illustrated, Section El: Electrical Week 8627, Aug. 13, 1986, p. 20.

Soviet Inventions Illustrated, Section Ch: Chemical, Week E06, Mar. 24, 1982, p. 16.

SEMICONDUCTOR WAFER PROCESSING APPARATUS

This application is a continuation-in-part of co-pending application Ser. No. 919,313, filed Oct. 15, 1986, entitled "Semiconductor Substrate Heater And Reactor Process And Apparatus", now U.S. Pat. No. 4,778,559 issued Oct. 18, 1988.

This invention relates in general to semiconductor integrated circuit (IC) wafer processing method and apparatus and more particularly to method and apparatus for automation of various fabrication steps in the semiconductor IC wafer fabrication process.

BACKGROUND

As semiconductor IC fabrication processing has developed, different wafer processing treatments have developed such as, for example, diffusion, oxidation, metalization, chemical vapor deposition (CVD) of thin films like epitaxial silicon and dielectric depositions like silicon dioxide and silicon nitride and ion implantation. Many of these treatments required heating of the wafer during treatment and removal of surface contaminants on the wafer before and/or after the treatments. Different methods and increasingly complicated physical structures have been developed and used for different treatments thereby complicating the semiconductor fabrication process, requiring more handling by personnel typically introducing contamination, increasing the time and space utilized in producing integrated circuits and often decreasing the yield.

Since the integrated circuit was first developed the complexity of the circuits has increased and the circuits have become more closely packed and more densely wired. The size of wafers on which the integrated circuits are made has steadily increased up to a current eight inches in diameter, and in many devices the processing steps have greatly increased in number. In 1983 a 64K (DRAM) Dynamic Random-Access-Memory device was manufactured on a four inch wafer with a minimum feature size of 2.5 to 4.0 micrometers using 132 process steps with 7 chemical vapor deposition steps and typically 18 wet chemical cleaning steps. Defects as small as 0.5 microns can have catastrophic effects on yield, and these defects can be caused by particulate contamination and/or defects in the thin films. Today a 4 MEG DRAM utilizes in excess of 150 process steps, a minimum feature size of less than 1.0 micrometers, in excess of 12 CVD process steps and more than 50 cleaning steps. The newer devices require less contamination, and people and chemicals contribute heavily to the contamination of semiconductor wafers.

Traditionally, chemical cleaning of wafers has involved immersion in a vat of hazardous chemicals in aqueous solution using a "wet deck" for a set amount of time. The wafers are removed from the bath, rinsed and spun dry. This sequence results in dilution of the bath and contamination of the device wafer due to exposure to air after each step. Scrubbing using brushes or high pressure fluid jets has been used in these wet processes. Newer cleaning processes have included centrifugal spraying and use of liquids flowing past the wafers.

Traditional wafer cleaning processes are not effective for removing contaminants in the manufacture of devices with a critical feature size of 3 microns or less. Cleaning chemistries in the liquid phase cannot reach into many miniaturized crevices and troughs typical of the geometry in the new generation of integrated circuits. After a wafer has been submerged in an industry-standard wet deck containing liquid cleaning chemistry, a droplet, influenced by surface tension, rests on top of the trough unable to remove contaminates in the trough and can deposit particulates and other contaminates there.

Environmental hazards are another major problem created by existing wet deck cleaning systems. The highly corrosive chemicals commonly used in traditional wet deck cleaning have proven to be hazardous to people and the environment.

A major source of contamination occurs in movement and storage of wafers from many of the processing steps into inventory of the partially processed wafer requiring individual cleaning steps before many of the subsequent treatment steps. This periodic movement of the wafer into and out of inventory adds to the chance of contamination and consequently reduced yield and contributes greatly to the expense of the equipment and manufacturing space required for producing a completed wafer.

With larger wafers and smaller critical feature sizes uniform heating of the wafer during the treatment steps has become more important. RF heating and radiant energy heating have been utilized. RF generators and infrared generators are expensive to manufacture and maintain as well as large in size, thereby consuming large areas of expensive floor space. The batch prosessing with these equipments added to the expense and potential contamination of IC fabrication. Still, these processes have resulted in non-uniformity of heating, especially with the larger diameter wafers being used to manufacture certain integrated circuits, and the methods and apparatus used for heating the wafer inhibited integration and automation of the various steps in fabrication of a semiconductor device wafer.

SUMMARY OF THE INVENTION

The object of the present invention is to provide method and apparatus for fabricating semiconductor wafers and which reduce time, expense and hazards in production and increase the product quality and yield.

Broadly stated the present invention is directed to semiconductor wafer processing method and apparatus wherein the wafer is handled in treatment apparatus and/or steps positioned in a substantially vertical position and moved automatically from one treatment apparatus or step to the next.

One aspect of the present invention includes the provision of method and apparatus for positioning the semiconductor wafers substantially vertically, directing a treatment medium, such as a cleaning and/or reactant substance, substantially horizontally against at least one face of the wafer and withdrawing the treatment medium away from the face of the wafer substantially coaxially and outwardly from the treatment medium being directed against the face of the wafer.

A feature and advantage of the invention is that this method and apparatus enables sequential integration and automation of known processes.

In accordance with another aspect of the present invention, method and apparatus are provided for establishing a substantially vertical wafer treating position and directing a treatment medium, such as cleaning or reactant substance, simultaneously, substantially horizontally in opposite directions against the wafer treating position and withdrawing the treatment medium away from the wafer treating position coaxially and outwardly from the medium being directed against the wafer treating position.

A feature and advantage of this aspect of the present invention is the ability to perform or position sequential treatment and/or cleaning and/or processing steps or apparatus closely spaced from one another whereby the wafer can be transferred from one apparatus or processing stage to the next, thereby minimizing potential contamination of the wafer and the amount of manufacturing space required for processing the wafer.

In accordance with another aspect of the present invention the processing apparatus comprises means for supporting at least one wafer substantially vertically at a wafer treating position along the horizontal axis of a processing housing, a first housing member centered on the housing horizontal axis on one side of the wafer treating position, means for introducing and directing a treatment medium in the form of a cleaning or reacting gas or vapor into the housing in a direction substantially parallel to the horizontal axis and toward and against the wafer treating position. A second housing member centered on the housing horizontal axis is provided with means for introducing and directing a treatment medium into the second housing in a direction substantially parallel to the horizontal axis and toward and against the wafer treating position in a direction opposite the direction of the treatment medium in the first housing member.

A feature and advantage of the invention is that at the wafer treating position either one or both sides of a wafer can be treated or one side of each of a pair of wafers can be treated simultaneously either similarly or differently.

In accordance with still another aspect of the present invention the treatment medium is introduced into the housing member in vapor phase.

In accordance with still another aspect of the present invention the treatment medium is directed for very low velocity or high velocity impingement upon the face of a wafer at the wafer treating position for treating the surface of the wafer and/or dislodging particles from the surface of the wafer.

In accordance with still another aspect of the present invention method and apparatus are provided whereby a wafer can be heated uniformly across the wafer.

In accordance with still another aspect of the present invention methods and means are provided for introducing radiation such as ultraviolet, infrared, and coherent light into the housing for use in the treatment of the wafer.

These and other features and advantages of the present invention will become more apparent upon a perusal of the following specification taken in conjunction with accompanying drawing wherein similar characters of reference identify similar structure in each of the several views.

DESCRIPTION OF THE PREFERRED EMBODIMENT

While the present invention is applicable to various aspects of methods and apparatus for processing semiconductor wafers, the invention is specially applicable to the production of integrated circuits through the treatment of semiconductor wafers, such as cleaning and surface processing of wafers which may include heating, etching, reacting and/or cleaning, in independent steps as well as in sequential integrated processing steps. The invention will be described with respect to a small number of steps performed in the processing of semiconductor wafers for integrated circuit manufacture.

Figure 1:
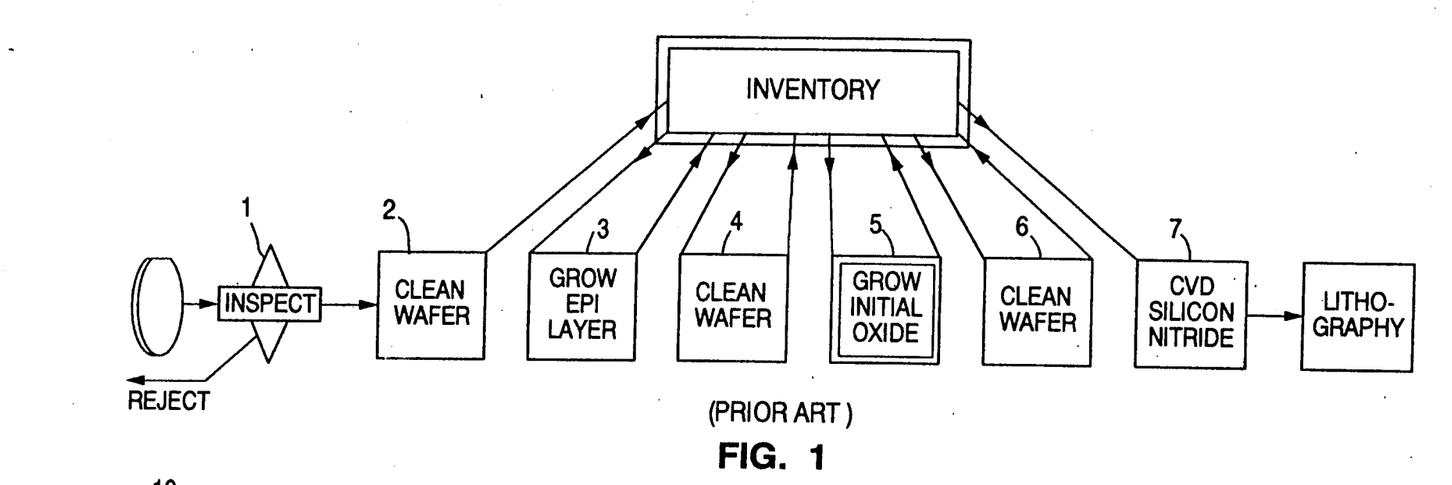
FIG. 1 is a schematic block diagram view of the first seven steps in a current prior art manufacturing process for a 64K DRAM IC.

Referring now to FIG. 1 there are shown the first 7 steps in a current state of the art or prior art manufacturing process for a 64K dynamic random-access memory (DRAM) IC device. Seven processing steps are shown beginning with inspection of the wafer at stage 1, following which the wafer is cleaned in step 2 and sent to inventory. In the third processing step the wafer is removed from inventory and an epitaxial EPI layer is grown on the wafer and the wafer returned to inventory. Before further processing the wafer is removed from inventory and run through a cleaning step 4 and returned to inventory. The wafer is removed from inventory for the fifth step which is shown as growing an initial oxide, and the wafer is then returned to inventory. Next, preparatory for further processing the wafer is removed from inventory and cleaned in step 6 and returned to inventory. Finally the wafer is removed from inventory and processed in the seventh step which is illustrated as a chemical vapor deposition (CVD) of silicon nitride. Following the seventh step the wafer is sent on to a lithograph step.

Figure 2:
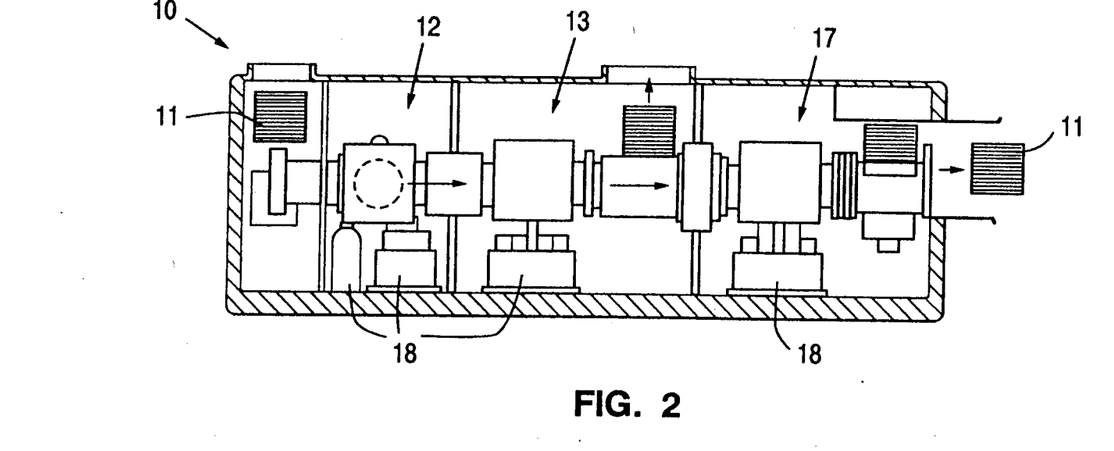
FIG. 2 is a schematic elevational view, partially in broken away and partially in block diagram form, illustrating the method and apparatus of the present invention.

In accordance with the present method and apparatus the wafer can be sequentially processed with the apparatus schematically illustrated in FIG. 2, wherein the wafer is directed into an assembly 10 including a cleaning apparatus 12, a treatment or deposition apparatus 13, such as for growing an EPI layer and directly into a further processing apparatus 17, such as for providing a CVD processing step such as the initial oxide. The seven steps shown in FIG. 1 are reduced to a processing treatment in an integrated processing apparatus which is adaptable to performing different functions. Wafers are introduced into the assembly 10 typically in wafer carriers 11 and individually automatically conveyed to the cleaning apparatus 12, treatment apparatus 13 and processing apparatus 17 from which they are removed and carried on for further steps in the manufacturing process in the wafer cassette 11. FIG. 2 schematically illustrates the utilization of appropriate processing treatment media and/or materials or reactants in the containers generally designated 18 which are appropriate for the particular step being carried on at the appropriate stage of the manufacturing process. If an independent cleaning step is required between the treatment step performed in treatment apparatus 13 and the processing step performed in the processing apparatus 17, a supplementary cleaning apparatus 12 can be inserted between the treatment apparatus 13 and the processing apparatus 17.

Figure 3:
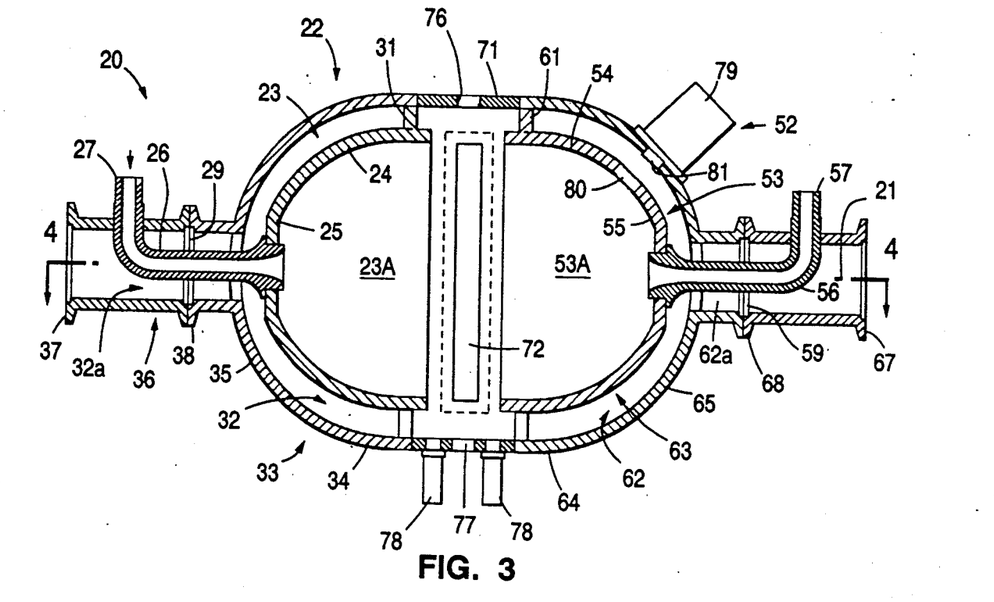
FIG. 3 is a side elevational, sectional view of a portion of the structure shown schematically in FIG. 2.
Figure 4:
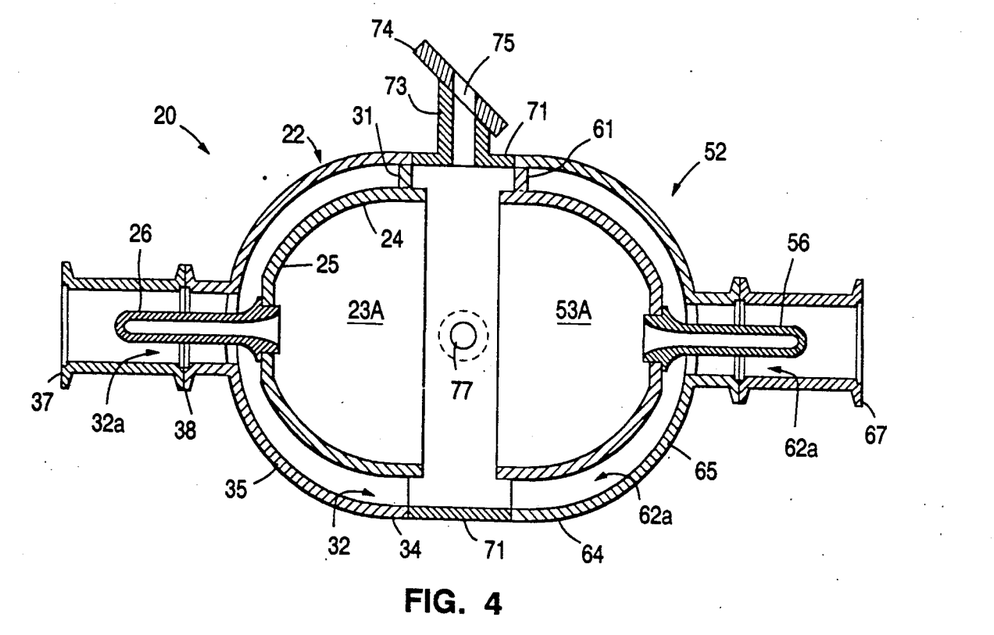
FIG. 4 is a sectional view of the structure illustrated in FIG. 3 taken along line 4—4 in the direction of the arrows.

Referring now to FIGS. 3 and 4 there are shown a side elevational sectional view and a horizontal sectional view, respectively, of a portion of the cleaning apparatus 12 which includes a processing housing 20 having a substantially horizontal axis along the sectional line 21 in FIG. 3. The housing 20 takes the form of a pair of reaction or cleaning hollow belljar shaped chambers on each of the opposite sides of a substantially vertical support position for semiconductor wafer(s). Processing media are directed from opposite horizontal directions to the wafer position.

The processing housing 20 includes a first housing member 22 having an inner cup shaped wall 23 made of a non-contaminating material such as TEFLON or silicon carbide and which includes a hollow cylindrical portion 24 open at one end and closed at the cup shaped end by a hemispherical portion 25.

The inner wall 23 is coaxially mounted within a similarly shaped outer cup shaped wall 33 which has hollow cylindrical and spherical portions 34 and 35 similar to but larger than the hollow cylindrical and spherical portions 24 and 25. Hollow cylindrical portion 24 includes a plurality of radially outwardly projecting spacer portions or members 31 positioned in the annular space 32 between the cylindrical portions 24 and 34 of the walls 23 and 33 for maintaining the walls in coaxially spaced apart position, and the spacer members 31 permit flow of media such as gas or vapor in the space between the walls 23 and 33.

Inner and outer coaxial tubular members 26 and 36 are provided to the center of the hemispherical portions 25 and 35, respectively. These tubular members 26 and 36 are maintained in coaxial spaced apart relation by an apertured annular spacer 29, such as of TEFLON, positioned in the annular space 32a between the tubular members 26 and 36 at a flanged joint 38 in the tubular member 36. Tubular member 26 bends and exits through an aperture in tubular member 36 to an inlet end 27. Tubular member 36 extends to an outlet end 37. The outer wall 33 and its connecting tubular member 36 are made of an inert material such as silicon carbide or TEFLON. The outlet end 37 of the tubular member 36 provides exit communication from the annular space 32a between the tubular members 26 and 36 and, therefore, exit from the annular space 32 between the inner and outer walls 23 and 33.

Spaced from and facing the open end of the first housing member 22 is a second housing member 52 which includes inner and outer wall members 53 and 63, respectively, shaped similar and connected to parts shaped similar to those connected to inner and outer wall members 23 and 33, respectively. The second housing member includes parts identified in the drawings with reference numbers in the number ranges in the 50's and 60's having digits corresponding to similarly constructed parts described above with reference numbers in the 20's and 30's.

The open ends of the outer cylindrical wall portions 34 and 64 of the first and second housing members 22 and 52, respectively, are connected to opposite sides of an annular ring 71 which has a dimension in the horizontal axial direction of the processing housing 20 such that the open ends of the inner walls 23 and 53 of the first and second housing members 22 and 23 are spaced apart so that semiconductor wafers can be positioned for treatment therebetween in a wafer treating position 72 with chambers 23A and 53A on opposite sides thereof within the respective inner wall members 23 and 53. Annular ring 71 has a vertically oriented, elongate, lateral extension 73 provided on the outer end thereof with a flange 74 for mounting a load/unload gate valve (not shown) for introducing wafers into and removing wafers from the wafer treating position 72 through a vertical passageway 75 in extension 73.

The inlet ends 27 and 57 of tubular members 26 and 56, respectively, enable injection of suitable media into chambers 23a and 53a in a direction substantially parallel to the horizontal axis 21 and toward the wafer treating position 72 to clean or treat opposite sides of a semiconductor wafer located at the wafer treating position 72 or a single side of each of a pair of wafers that are positioned on a heating assembly such as that illustrated in FIG. 7 and described below. The media introduced on the horizontal axis of the processing housing 22 are vacuum drawn out of the housing 22 through the annular spaces 32-32a and 62-62a surrounding and coaxial with introduced media. This construction provides for application of the media uniformly across the surface of the wafer.

Wafer injection and transporting structure, such as automatically controlled robotic mechanisms, can move vertically oriented wafers either laterally into the cleaning apparatus 12 as shown in the apparatus of FIGS. 3 and 4 or through the cleaning apparatus 12 as schematically illustrated in FIG. 2 or vertically into and out of the processing housing 20.

The top and bottom portions of the annular ring 71 are apertured at 76 and 77, respectively, for actuating members (not shown), such as pairs of solenoid operated gripping fingers, for gripping the wafer which has been moved into the wafer treating position 72 by the wafer injecting and transporting structure.

A pair of light sources 78 can also be positioned on the opposite sides of the aperture 77 on the bottom of annular ring 71 to provide a beam immediately adjacent the wafer surface.

A radiation source 79, such as a ultraviolet or infrared source, a broadband source or a coherent light source from a lamp, filament, laser or plasma discharge, is positioned on one or both of the housing members 52 and 22 for transmission of radiation through appropriate windows 80 and 81 in inner and outer walls 55 and 65 into the chambers 53A and 23A for providing radiation desired for a reaction in the chambers 53A and 23A.

In accordance with this invention a semiconductor wafer or pair of wafers are moved into the wafer treating position and treated such as with a cleaning or reacting medium injected into the chambers 23A and 53A from the inlets 27 and 57. The treating media from chambers 23A and 53A are respectively withdrawn coaxially with respect to the media being introduced and through the annular spaces 32-32a and 62-62a and outlets 37 and 67. The wafer surfaces facing the chambers 23A and 53A can be treated the same, such as with the same medium, or differently, such as with a different treatment medium. If desired a diffuser plate (not shown) can be positioned in each of the chambers 23A and 53A for diffusing and distributing the medium injected therein for more uniform application to the face of the wafer.

The treatment apparatus 13 shown in FIG. 2 can take the same physical configuration as the processing housing 20 shown in FIGS. 3 and 4 and appropriate reactants introduced and directed to the appropriate wafer surface to grow the EPI layer.

A semiconductor wafer processing method and apparatus in accordance with the preferred embodiment of this invention as illustrated in FIGS. 3 and 4 has a processing housing 20 with inner walls 23 and 53 having an inside diameter of 7 inches and axial length of 8 inches and outer walls 33 and 63 having an inside diameter of 9 inches. This apparatus will process 6 inch diameter wafers with flow rates of the media from 1 cc to 100 l. per minute and possible chamber pressures over the range from $10^{-8}$ Torr to 250 psi. Using this diameter apparatus or larger to accommodate larger wafers this method and apparatus will process in the range of 30 to 180 five inch to twelve inch diameter wafers per hour.

Figure 5:
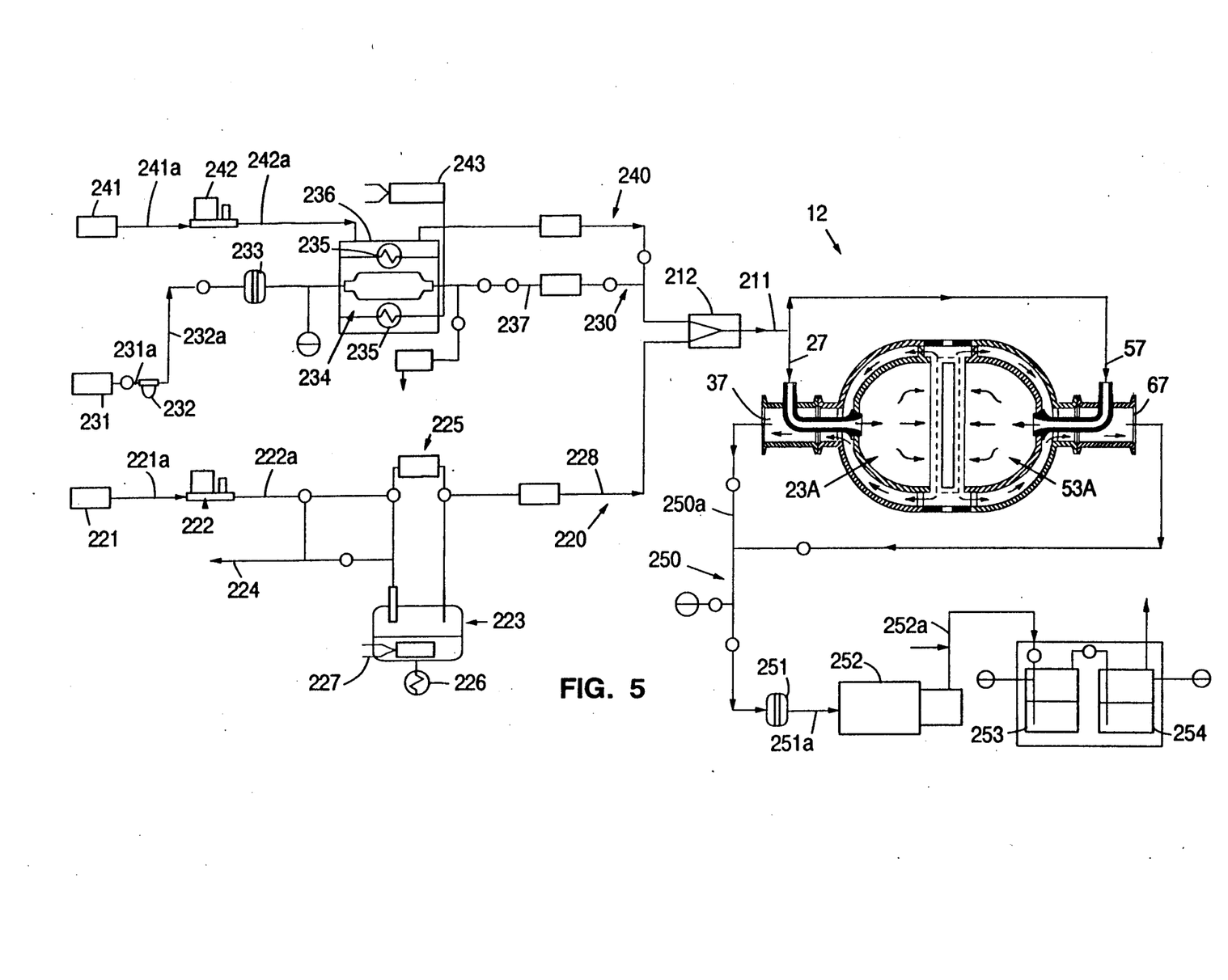
FIG. 5 is a schematic flow diagram illustrating a use and operation of the structure illustrated in FIGS. 3 and 4.

An illustrative example of vapor phase hydrogen fluoride (HF) etching of silicon dioxide utilizing the present invention is provided in FIG. 5. As shown there, a cleaning apparatus 12 in accordance with the present invention is supplied at the inlet ends 27 and 57 for chambers 23A and 53A with vapor phase media from a line 211 from a mixing block 212 which receives media from either a vapor HF heated line 220, a steam heated line 230 and/or a purge nitrogen ($N_2$) line 240.

For the vapor HF line 220 a $N_2$ carrier 221 is passed through a line 221a to a mass flow controller 222 and then via a line 222a and appropriate valving either to a HF source 223, a mass flow controller bypass to exhaust 224 or a purge line 225 bypassing the HF source 223. The HF source 223 is an aqueous solution of HF and $H_2O$. A sizeable volume of HF-$H_2O$ mixture is kept in a plastic container immersed in a constant temperature heating bath 226 and stirred by a magnetic stirrer 227. The nitrogen carrier gas 221 is passed over the surface of the HF-$H_2O$ liquid at a constant flow rate. The $N_2$-$H_2O$-HF mixture exiting the source 226 is passed through an insulated TEFLON tubing 228 that is heated to at or above the temperature of the liquid so as to prevent condensation in the tubing. The steam in steamline 230 is generated from deionized water in a reservoir 231 through a line 231a to a pressure regulator 232 such as a high pressure relief valve (40-150 psi) and via line 232a through appropriate valving and a submicron filter 233 and to and through a super heated steam generator 234 heated by heaters 235 in a insulated chamber 236. The steam is carried through an insulated and heated tubing 237 to the mixing block 212.

Nitrogen ($N_2$) used for a system purge or a micro rinse drying cycle from a $N_2$ source 241 is conveyed via line 241a through a mass flow controller 242 and then via line 242a through the chamber 236 wherein the temperature of the nitrogen can be controlled via the temperature control 243 for passage through line 240 to the mixing block 212 and the cleaning apparatus 12.

Flow control of the media through the cleaning apparatus 12 is established in the exhaust assembly which includes exhaust line 250a connected to the outlet ends 37 and 67 and in turn directed to a particulate filter 251 connected in turn via line 251a to a vacuum pump 252. The exhaust from vacuum pump 252 is passed via line 252a first through an acid trap 253 and then a base trap 254 to the facility exhaust.

The automated process utilizing the cleaning apparatus 12 includes (a) a first step of pressurizing the chamber of the cleaning apparatus 12 to a positive pressure such as with $N_2$ from line 241, (b) opening the load/unload valve, (c) loading and positioning the wafer in the chamber, (d) closing the load/unload valve, (e) evacuating the chamber to approximately $10^{-3}$ Torr, (f) heating the wafer to processing temperature if required, (g) adjusting the chamber pressure to the processing level and selecting the appropriate programmed process sequence.

For HF removal of oxides the sequence includes (h) directing the desired amount of HF and an amount of steam, if required, to the mixing valve 212 (i) turning the HF off, (j) directing only $N_2$ carrier gas to the chamber, (k) pumping the system to purge the chamber to about 20 Torr, (1) back-filling the chamber with $N_2$ and (m) opening the gate valve and removing the wafer.

Figure 6:
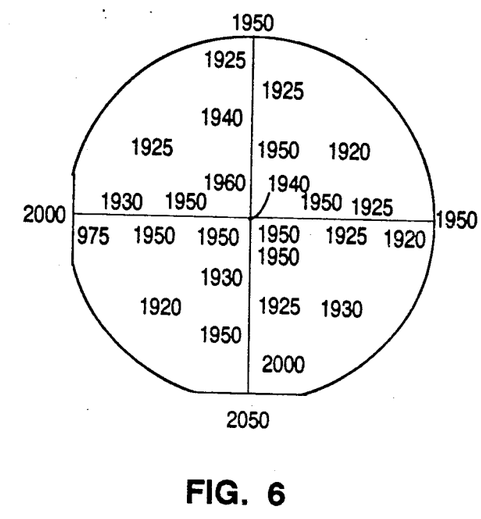
FIG. 6 is an elevational view of a wafer illustrating the uniformity of a wafer surface layer after partial removal of a silicon dioxide layer generally utilizing the structure of FIGS. 3 and 4.

Utilizing the apparatus and method of this invention the foregoing total process sequence removed about 1,000 Å of silicon dioxide over a period of less than two minutes. By maintaining chamber pressure in the 20-500 Torr range and a flow of the $N_2$ carrier at about 10 SLPM, the entire wafer is etched to a high degree of uniformity. FIG. 6 which shows the remaining oxide thickness in angstroms at various locations across the wafer after the etch shows a uniformity of plus or minus 2% across the wafer when excluding the outer 0.25" edge of the wafer.

In the foregoing process the HF consumption was calculated, and it was found that the HF solution was depleted at a rate of 0.25-0.40 cc/min. at the optimum uniformity mass flow rate. At the etch rate of 20 Å/sec., the time required to strip 100 Å of oxide from the wafer was 5 seconds and in this time approximately 0.01 cc of HF was consumed. This indicates that approximately 20,000 six inch diameter wafers may be processed to remove 100 Å of silicon dioxide while using less than one liter of HF solution. This compares with the reported consumption rate of 500-750 liters per 10,000 wafers required in the current standard wet deck HF processing.

This invention not only reduces the required amount of chemicals but also avoids the disposal of any significant quantity of unused chemicals following the wafer processing.

Besides the HF oxide removal, the present method and apparatus includes a removal sequence for oxides/organics/metals using the following processing treatments:

1. Ozone treatment using mixture of $O_3/O/O_2$;
2. HF-$H_2O$;
3. $H_2O$ in vapor state and/or liquid state for rinse;
4. $NH_3/O_3/H_2O$;
5. $H_2O$ in vapor state and/or liquid state for rinse;
6. Hot $N_2$/Ar or isopropyl alcohol dry; and
7. Transfer wafer to reactor or cassette.

An alternative removal sequence to the sequence just previously described would include, after the second $H_2O$ rinse in step No. 5, the treatment step of $HCl/O_3/H_2O$.

Figure 7:
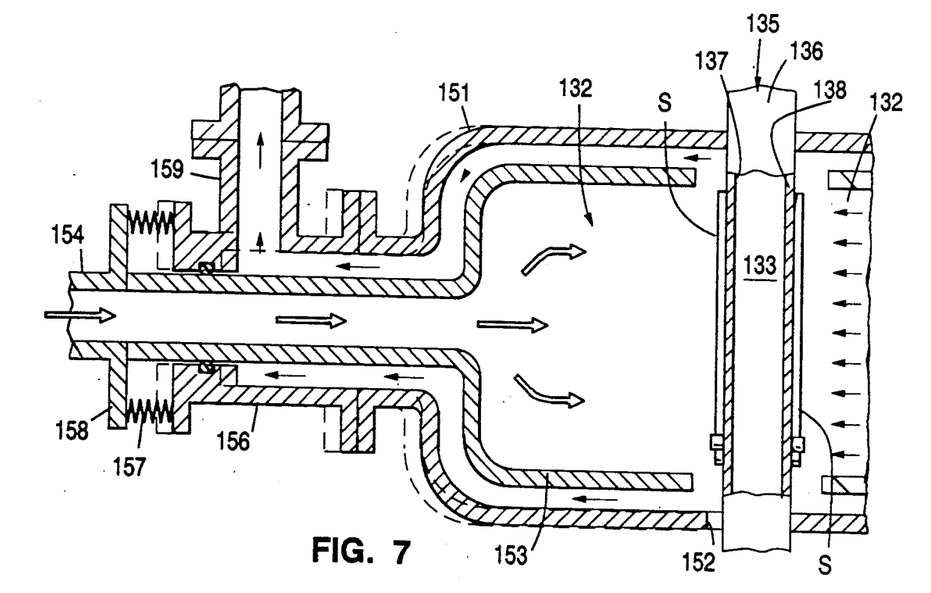
FIG. 7 is a side elevational sectional view of an alternative embodiment of a portion of the structure illustrated in FIG. 2.

The treatment and processing apparatus 17 can be constructed similar to the processing housing shown in FIG. 7 which illustrates heating apparatus 135 at the wafer processing position and comprising a container 136 with front and back walls 137 and 138 located between a pair of reaction chambers 132, one of which is only partially shown. The reaction chamber 132 includes an outer wall 151 somewhat in the form of a hollow belljar, the larger open end of which is connected to the heating apparatus 135 around three sides thereof but open on the chamber 132 against one of the walls 137 and 138 of the heating apparatus. Inside the chamber member 151 is another chamber member 153 of similar shape, but smaller size providing a space between the members 151 and 153 for exhaust of reactant materials. Member 153 has a hollow cylindrical stem 154 which serves an as inlet for introducing reactant gases into the chamber member 153 in a direction toward the wafer S position at the larger opposite end of the chamber 153. A hollow cylindrical sleeve 156 is sealably connected to the end of chamber 151 remote from the location of the wafer S and is connected by a flexible joint 157 to a flange 158 on the stem 154 of the inner chamber 153. A lateral outlet port 159 extends from the sleeve 156 and provides communication to the annular region between the sleeve 156 and the stem 154 which is in turn in communication with the space between the chambers 151 and 153.

Preferably the walls of the heating apparatus 135 are formed from materials with high conductive properties, such as solid silicon carbide. Such conductive surfaces are desired to permit maximum transfer of heat to the external surfaces of the walls 137 and 138 and to a wafer or semiconductor substrate S mounted thereon. The container 136 is substantially filled with a low melting point, high boiling point medium or material 133. For processing semiconductor substrates or wafers, the material 133 has a melting point below 350° C. and a boiling point above 1000° C. The preferred material is essentially indium but bismuth and eutectic mixtures of indium and bismuth and other low melting point, high boiling point materials such as tin are also satisfactory.

At least one insulated resistive heating element (not shown) is positioned directly in the material 133 in the container 136. The heating element must be capable of generating high temperatures to melt the medium 133 and heat that medium 133 to a sufficiently high temperature without vaporizing the medium 133 so that a semiconductor wafer or substrate positioned in direct contact with the external surface of container walls 137 and 138 will be heated to the elevated temperature necessary to treat the wafer or substrate.

Processing gases can be introduced through the stem 154 into the interior of chamber 153 for direct application on the face of the wafer S. Gases can be exhausted from the region adjacent the face of wafer S through the space between chambers 151 and 153 and out the exhaust port 159. The flexible joint 157 allows movement of at least a portion of the outer chamber wall 151 on the port side of the heating apparatus 156 to open and close a region enabling the wafer to be inserted into the reaction chamber and positioned on the wall of the heater apparatus 135 and then removed from the reaction chamber after the appropriate processing step. The wafers can be transported to and from the reactor system in conventional carriers or cassettes and can actually move through a similarly configured chamber apparatus for cleaning (as described with reference to FIGS. 3 and 4) immediately prior to processing in the reaction chamber.

The terms and expressions which have been employed here are used as terms of description and not of limitations, and there is no intention, in the use of such terms and expressions, of excluding equivalents of the features shown and described, or portions thereof, it being recognized that various modifications are possible within the scope of the invention claimed.

I claim:

1. Semiconductor wafer processing apparatus comprising, in combination, a processing housing having an axis, means for supporting at least one wafer at a wafer treating position along said housing axis and substantially normal thereto, a first housing member centered on said axis along one side of said wafer treating position, means for introducing and directing a treatment medium into said first housing member in a direction substantially parallel to said axis and toward said wafer treating position, a second housing member centered on said axis on the other side of said wafer treating position, and means for introducing and directing a treatment medium into said second housing member in a direction substantially parallel to said axis and toward said wafer treating position, each of said first and second housing members comprising a first inner cylindrical wall portion and a second outer cylindrical wall portion, said wall portions being coaxial and defining an inner cylindrical chamber for direction the treatment medium towards said wafer treating position and an outer annular chamber for directing the treatment medium away form said wafer treating position, the opening into said annular chamber being substantially radially outward from said wafer treating position.

2. Semiconductor wafer processing apparatus comprising, in combination, a processing housing having a substantially horizontal axis, means for supporting at least one wafer substantially vertically at a wafer treating position along said housing horizontal axis, a first housing member centered on said horizontal axis on one side of said wafer treating position, means for introducing and directing a treatment medium into said first housing member in a direction substantially parallel to said horizontal axis and toward said wafer treating position, a second housing member centered on said horizontal axis on the other side of said wafer treating position and means for introducing and directing a treatment medium into said second housing member in a direction substantially parallel to said horizontal axis and toward said wafer treating position, each of said first and second housing members comprising a first inner cylindrical wall portion and a second outer cylindrical wall portion, said wall portions being coaxial and defining an inner cylindrical chamber for directing the treatment medium toward said wafer treating position and an outer annular chamber for directing the treatment medium away from said wafer treating position.

3. The apparatus of claim 2 wherein said supporting means will support only a single wafer at said wafer treating position whereby one side of ht single wafer will receive a treatment medium introduced into said first housing and the other side of the single wafer will receive a treatment medium introduced into said second housing.

4. The apparatus of claim 2 wherein said supporting means will support a pair of wafers back to back whereby the front of one wafer will receive a treatment medium introduced into said first housing and the front of the other wafer will receive a treatment medium introduced into said second housing.

5. The apparatus of claim 4 wherein said supporting means includes a flat wall for heating at least one wafer by conduction and a heat transfer means comprising a low melting point, high boiling point metal contained within said supporting means in contact with said flat wall.

6. The apparatus of claim 2 wherein said introducing and directing means includes means for introducing a treatment medium in vapor phase.

7. The apparatus of claim 2 wherein said introducing and directing means includes means for introducing a treatment medium for very low to high velocity impingement upon the face of a wafer at said wafer treating position.

8. The apparatus of claim 2 including means for maintaining at least said first housing at subatmospheric pressure during introduction of said treatment medium.

9. The apparatus of claim 2 including means for maintaining at least said first housing at superatmospheric pressure during introduction of said treatment medium.

10. The apparatus of claim 2 including means for introducing radiation into at least said first housing.

11. The apparatus of claim 2 including means for automatically moving a wafer into and out of said housing.

12. The apparatus of claim 11 including means for automatically moving a wafer from said housing to another wafer treating apparatus.

* * * * *